United States Patent [19]

Schnur et al.

[11] Patent Number: 5,731,704
[45] Date of Patent: Mar. 24, 1998

[54] METHOD AND ARRANGEMENT FOR MEASURING AND CONTROLLING THE BASIC FIELD OF A MAGNET OF A NUCLEAR MAGNETIC TOMOGRAPHY APPARATUS

[75] Inventors: Guenter Schnur, Hemhofen, Germany; Claude Reymond, Petit-Laney; Pascal Sommer, Meyrin Geneve, both of Switzerland

[73] Assignee: Siemens Akteingesellschaft, Munich, Germany

[21] Appl. No.: 715,893

[22] Filed: Sep. 19, 1996

[30] Foreign Application Priority Data

Sep. 29, 1995 [DE] Germany ............ 195 36 390.6

[51] Int. Cl.[6] ................................................ G01V 3/00
[52] U.S. Cl. ................................. 324/320; 324/319
[58] Field of Search ........................... 324/320, 319, 324/318, 322, 317, 309, 300; 335/216, 296

[56] References Cited

U.S. PATENT DOCUMENTS

| | | | |
|---|---|---|---|
| 4,070,611 | 1/1978 | Ernst | 324/300 |
| 4,284,950 | 8/1981 | Burl et al. | 324/320 |
| 4,623,844 | 11/1986 | Macovski | 324/320 |
| 4,949,044 | 8/1990 | Starewicz et al. | 324/320 |
| 5,200,701 | 4/1993 | Siebold et al. | 324/309 |
| 5,210,512 | 5/1993 | Davies | 335/216 |
| 5,245,286 | 9/1993 | Carlson et al. | 324/303 |
| 5,302,899 | 4/1994 | Schett et al. | 324/317 |
| 5,631,561 | 5/1997 | Stetter | 324/320 |

FOREIGN PATENT DOCUMENTS

OS 44 19 061 7/1995 Germany.
2 276 942 12/1994 United Kingdom.

OTHER PUBLICATIONS

"Bildgebende Systeme für die Medizinische Diagnostik," Krestel (pub.) 2nd ed. 1988, pp. 491–492.
"Fourier Transform N.M.R. Spectroscopy)", (2nd ed.), Shaw, 1984, pp. 139–182.

Primary Examiner—Louis M. Arana
Attorney, Agent, or Firm—Hill, Steadman & Simpson

[57] ABSTRACT

Two MR magnetic field probes arranged in a centrally symmetrical fashion in relation to the magnetic field center, are attached in the examination area of the magnet. The output signals of the two MR magnetic field probes are supplied to a multiplying RF mixer, and a sum frequency signal is obtained from the output signal of the RF mixer, and the actual value of the basic field is determined from the frequency of this output signal.

18 Claims, 11 Drawing Sheets

METHOD AND ARRANGEMENT FOR MEASURING AND CONTROLLING THE BASIC FIELD OF A MAGNET OF A NUCLEAR MAGNETIC TOMOGRAPHY APPARATUS

BACKGROUND OF THE INVENTION

1. Field of the Invention

The present invention is directed to a method and an arrangement for measuring and controlling the basic field of a magnet of a nuclear magnetic tomography apparatus

2. Description of the Prior Art

Nuclear magnetic tomography devices currently in use generally employ the Fourier method for image reconstruction, as was first proposed by Ernst, Kumar and Welti (U.S. Pat. No. 4,070,611). The nuclear magnetic resonance signal is thereby phase-coded in at least one direction. This method requires an extremely high chronological stability of the basic field that serves for the nuclear spin polarization, since otherwise the image quality is considerably worsened by artifacts (smearings in the direction of the phase coding gradient). This is explained in more detail in the book of E. Krestel (publisher), "Bildgebende Systeme für die medizinische Diagnostik," second edition 1988, under the section "Feldstabilität" on pages 491 and 492. With the field strengths that are usual today for nuclear magnetic tomography equipment, from 0.1 to 2.0 T, and the currently standard pulse sequences, a field stability of within 20 to 80 nT is required. This field stability must be maintained over a time region from a few ms up to several seconds (corresponding to a frequency range of a few tenths Hz up to some 10 Hz); at higher frequencies (or shorter times) the requirements diminish strongly. Expressed relative to the basic field strength, this requirement corresponds to a precision of 0.1 ppm to 0.01 ppm and less.

This requirement holds both for the field stability of the magnetic field generated by the basic field magnet itself and also for external influences.

Sources of external disturbance include e.g. magnetized vehicles in the terrestrial field or the stray field of the magnet that are moving in the vicinity of the magnet, or conductors through which alternating current or variable direct current flows (transformers, contact wires of railway lines, etc.). In the absence of specific measures, such sources of disturbance must be at a large distance from the site of installation of the nuclear magnetic tomography equipment if their influence is to be disregarded. For example, a streetcar whose contact line power amounts to 500 A generates a disturbance field of 50 nT at a distance of two kilometers, if it is assumed that the decay of the field is inversely proportional to the distance. In practice, it is hardly possible to find an installation site for a nuclear magnetic tomography apparatus at which the external disturbing influences remain within tolerable limits at the apparatus itself without special measures.

Depending on the type of magnet, various measures are known for avoiding field instabilities. There is a distinction between the stability of the magnetic field generated by the apparatus itself and external disturbances. Permanent magnets must be temperature-stabilized so that they are sufficiently stable. Superconducting magnets in standard squirrel-cage operation (field decay less than 0.1 ppm/hour, as a rule) are inherently stable. In normally conducting magnets, the difficulty is to hold the supply current constant over time (according to field strength at less than 0.1 ppm).

With respect to external disturbances, superconducting magnets likewise have clear advantages. If they do not comprise what are called active stray field shieldings, they dampen external disturbances at least partially, i.e. by approximately a factor of 10, due to the Meissner-Ochsenfeld effect. Given an active stray field shielding, consisting of an external shielding winding connected in series in the opposite direction, the shielding effect against external disturbing fields can be restored by means of a superconducting auxiliary winding having relatively few turns. An arrangement of this type is described in European Application 0 468 415. In addition, it has been determined that the supercooled radiation plates in the superconducting cryostatic temperature regulator dampen field disturbances with frequencies greater than a few Hertz quite well, by means of excited eddy currents, due to their good electrical conductivity.

In contrast, permanent magnets of the ring type, normally conducting air coil magnets in a Helmholtz arrangement and permanently magnetic or electrically actuated yoke magnets shield poorly against external disturbances, in particular if they are of relatively open construction for better patient access. A yoke magnet with a one-sided yoke and an open construction is, for example, specified in U.S. Pat. No. 5,200,701.

For magnet systems with permanent magnets or normally conducting magnets, an active disturbance field compensation is thus required, as a rule.

An arrangement of this type is known for example from U.S. Pat. No. 5,245,286. A sensor coil is thereby positioned around each pole shoe of the magnet, by means of which the respective magnetic field is acquired. Due to a spatially symmetrical arrangement of the sensor coils in the magnet and their connection in series, the influence of the pulsed gradients on the measured magnetic field is thereby eliminated. Depending on a deviation of the magnetic field from a target value, acquired using the sensor coils, a compensating coil encompassing the entire measurement compartment is driven. Unchanging components or very low-frequency changes of the magnetic field, however, cannot be measured with sensor coils.

It is known from U.S. Pat. No. 4,234,950 to use so-called MR probes for the measurement of field non-homogeneities of a magnet for nuclear magnetic tomography equipment. These Mr probes exploit the fact that the nuclear magnetic resonance frequency for a particular type of nucleus is strictly proportional to the applied magnetic field. In this arrangement, however, the measurement does not ensue during the image acquisition and without switched gradients. External field disturbances can, however, arise erratically during the course of the pulse sequence. Control of the basic field solely outside the measurement cycles is thus suited for superconducting magnets if necessary, since the cooling plates thereof shield the higher-frequency portions of the disturbance fields.

From British Specification 2 276 942, it is known to use an ESR magnetometer for the measurement of the magnetic field. Influences of gradients on the magnetometer are compensated, e.g. by means of compensating coils. A signal is derived from the resonant frequency of the magnetometer, what is proportional to the field deviation, and is used for the stabilization of the magnetic field.

In German OS 44 19 061, an arrangement for the measurement of the basic field is proposed in which two MR magnetic field probes are attached in the examination area so as to be arranged in a centrally symmetrical fashion with respect to the center of the magnetic field, and in which the measurement signals of the two MR magnetic field probes are added in a correction apparatus in such a way that the effect of pulsed magnetic field gradients is eliminated. The calculation of the MR frequency used for the field measurement is carried out by means of the time derivative of the phases of the separately acquired and demodulated nuclear magnetic resonance signals. Since two complete measurement channels with demodulators, filters and analog/digital converters are required, this arrangement is quite expensive.

SUMMARY OF THE INVENTION

An object of the present invention is to acquire chronological instabilities of the basic field of a nuclear magnetic tomography installation in as precise a manner as possible, and in a manner which permits a substantially continuous measurement to be possible. The hardware outlay for the measurement apparatus should remain low.

The above object is achieved in a method and an arrangement for measuring a basic magnetic field produced by a magnet of a nuclear magnetic resonance tomography apparatus, wherein first and second MR magnetic field probes are positioned relative to the examination region so as to be centrally symmetrical with respect to a center of the magnetic field, and a multiplying RF mixer is supplied with the respective output signals from the probes, the mixer emitting a sum frequency signal obtained by multiplying the respective output signals of the probes. The actual value of the magnetic field is identified from the sum frequency of the sum frequency signal.

The influence of switched magnetic field gradients is thereby eliminated, so that a measurement of the magnetic field that is substantially if not completely free of interruptions is possible. By the use of a multiplying RF mixer, a sum frequency signal is obtained as a scale for the magnetic field to be measured, and thus a second measurement channel with a phase-sensitive demodulator, filter, analog/digital converter, etc., is not needed.

DESCRIPTION OF THE PREFERRED EMBODIMENTS

Figure 1:
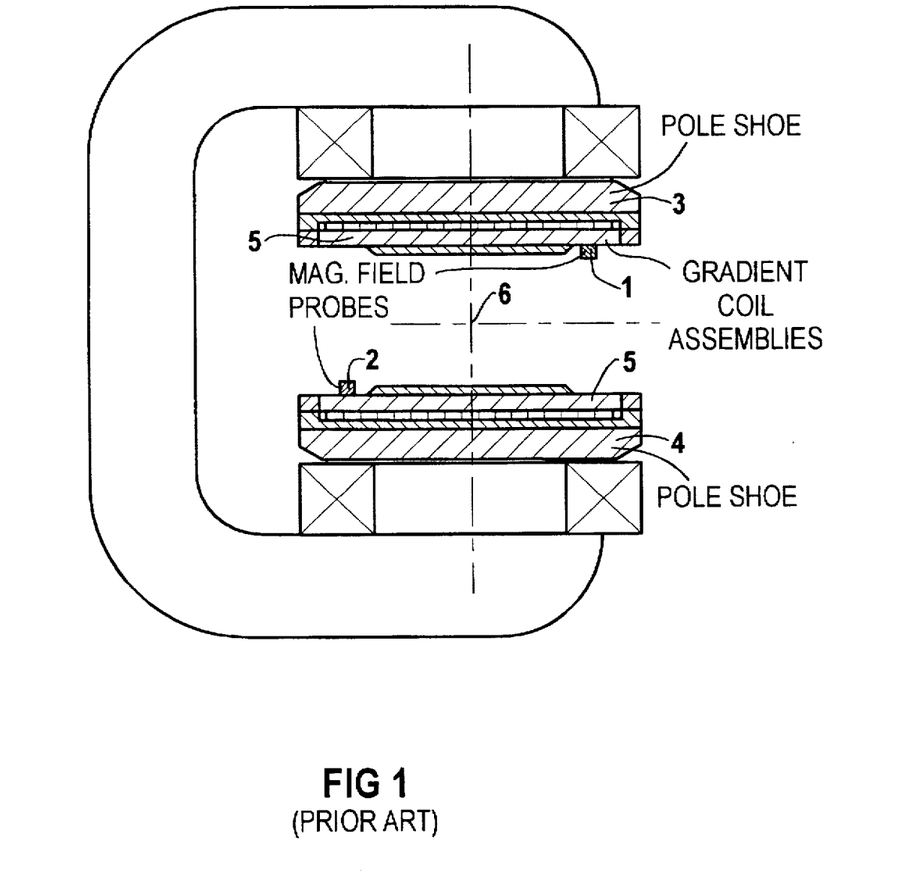
FIGS. 1 to 3 respectively show various arrangements of magnetic field probes in nuclear magnetic tomography apparatus with magnets of different construction.

FIG. 1 schematically shows a pole shoe magnet of a nuclear magnetic tomography apparatus with a one-sided yoke. The magnetic actuator is not shown for clarity, and can consist either of permanent magnets or normally conducting magnetic coils. Gradient coil assemblies 5 are respectively attached in the region of the pole shoes 3 and 4. The center of the magnet is designated 6. Two magnetic field probes 1 and 2, called "probes" for short hereinafter, are arranged symmetrically with respect to this center 6. An individual probe in the center of the system, where the field deviation (i.e. the disturbance) by pulsed gradients of all three axial directions is at a minimum, is not possible, since during operation a patient to be examined is located there. An individual probe in the region of the pole shoes cannot distinguish between the basic field disturbances that are undesirable, regarded in themselves, and the desired effects of the gradient fields. Additional corrective measures are thus required for an individual magnetic field probe. In contrast, given a placement of two probes arranged so as to be centrally symmetrical with respect to the center of the magnet, the influence of gradient field pulses can be eliminated by means of addition of the measurement signals of both magnetic field probes, and disturbances of the basic field can thereby be measured.

Figure 2:
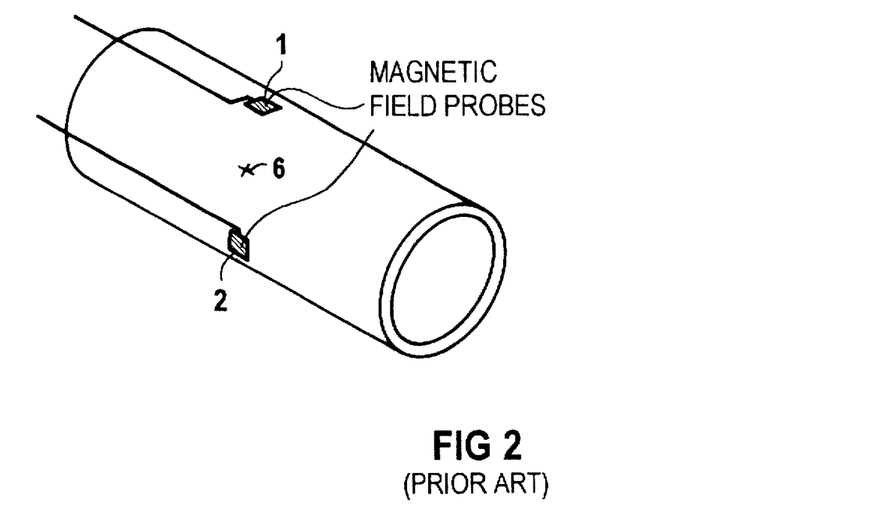
Figure 3:
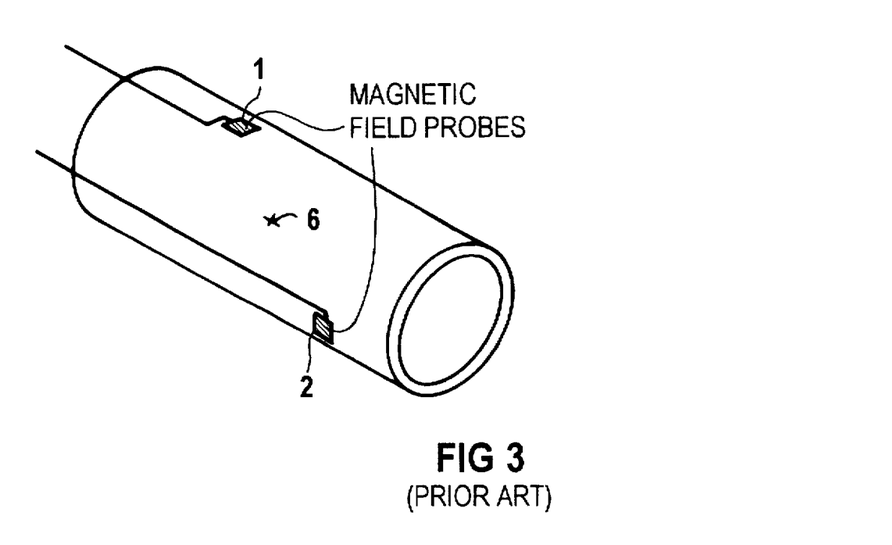
Figure 4:
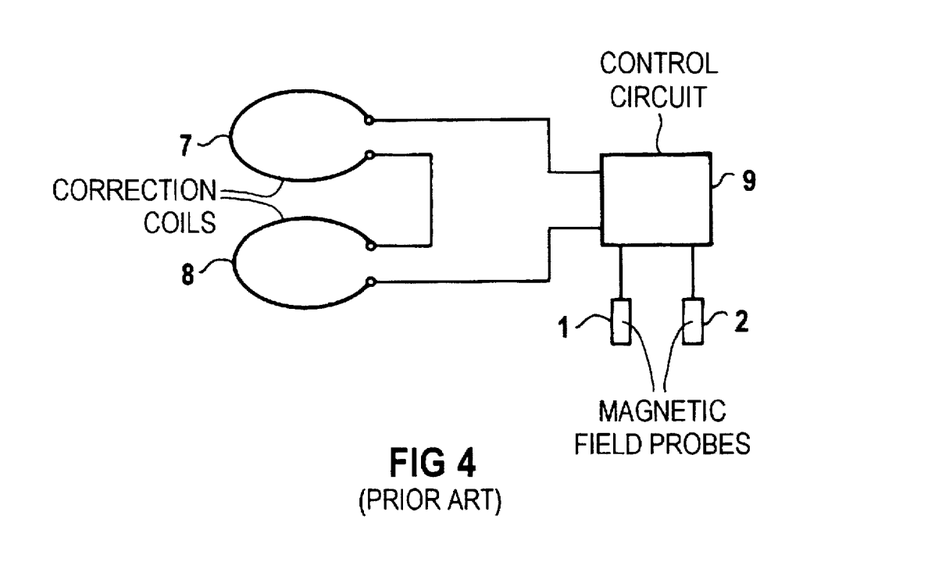
FIG. 4 shows a schematic representation of a control unit for the magnetic field.

FIGS. 2 and 3 show corresponding examples for probe positions in axial magnets. As shown in FIG. 2, the two probes 1 and 2 are positioned in the positions +y, −y. As shown in FIG. 3, however, they can also lie on a diagonal position (e.g. −z, −x according to FIG. 3). It is important that a central symmetry be present in relation to the magnet coordinates, so that the probes 1 and 2 see the pulsed gradient fields as a field pulse of respectively different polarity. As shown in the schematic representation in FIG. 4, the output signals of the probes 1 and 2 are supplied to a control circuit 9, where they are added so that the disturbances arising from the gradient pulses are eliminated. The output of the control circuit is connected to correction coils 7 and 8, by means of which the field of the magnet is controlled to a target value.

MR probes are particularly well suited as magnetic field probes. Other known probes have various disadvantages. For example, pickup coils acquire field changes well, but require an integrator that generates a drift, or the lower frequency boundary is not null. With Hall generators, even slow field changes can be acquired without difficulty, but in the high basic field these are not precise enough, and moreover exhibit thermal drift. Slow field changes can also be acquired with flux gates, but the precision in the high basic field is likewise unsatisfactory.

MR probes, in contrast, are well-suited for use in the high basic field, and all field components are acquired that are also important for nuclear magnetic tomography. The field measurement is of practically unlimited precision, even given arbitrarily slow field changes. If, however, conventional continuous-wave methods are used in connection with lock-in detection, rapid field changes, which are unavoidably produced by the pulsed gradients, cannot be acquired. MR probes that operate according to the pulse NMR spectrometer principle are thus preferably used. This principle is known for spectrometers e.g. from D. Shaw, Fourier Transform NMR Spectroscopy, Scientific Publ. Co. Amsterdam, 1984, ch. 6.

Figure 5:
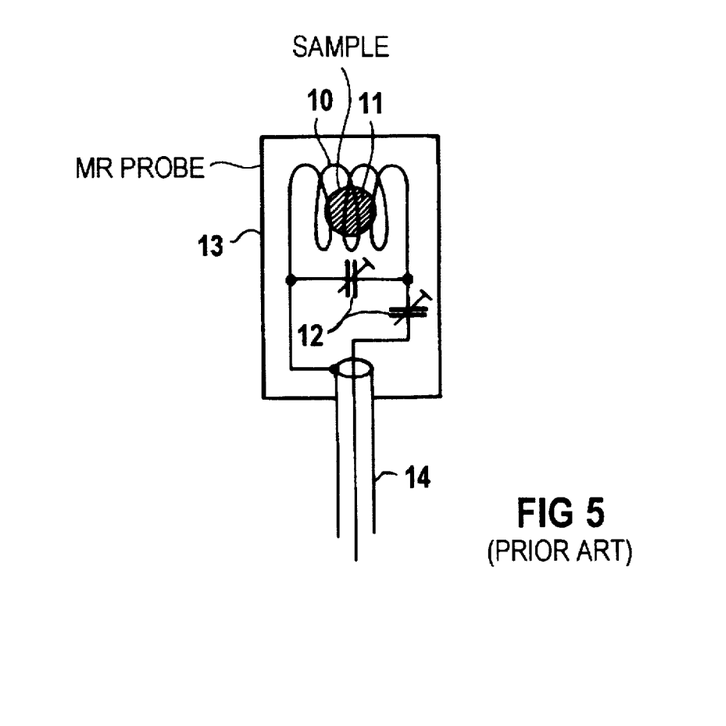
FIG. 5 shows a schematic view of the construction of an MR probe as a magnetic field probe.

FIG. 5 schematically shows the construction of an MR probe 13. A sample 11 is arranged in a coil 10. The coil 10 is connected with a measurement circuit via a matching circuit with trimmer capacitors 12 and a coaxial line 14. Nuclear spins are excited in the sample 11 via the coil 10, and then deliver a nuclear magnetic resonance signal. The operating frequency of the probe depends on the magnetic field and on the material of the sample. As sample material, a liquid or a gel with a high density of MR-suitable nuclei with a long $T_2$ time is advantageously used. If, for example, water is used, the operating frequency of the MR probe will match the operating frequency of the nuclear magnetic tomography equipment, with which as a rule proton imaging is carried out. So that the high frequency supplied to the MR probe does not disturb the measurement procedure for the image, care must then be taken to provide a very good shielding of the MR probe and the supply line thereof. Alternatively, a sample material can be used with atomic nuclei whose magnetic resonance frequency deviates from the proton resonance frequency. Fluoride compounds, for example, are well-suited for this purpose, due to their high MR sensitivity.

Figure 6:
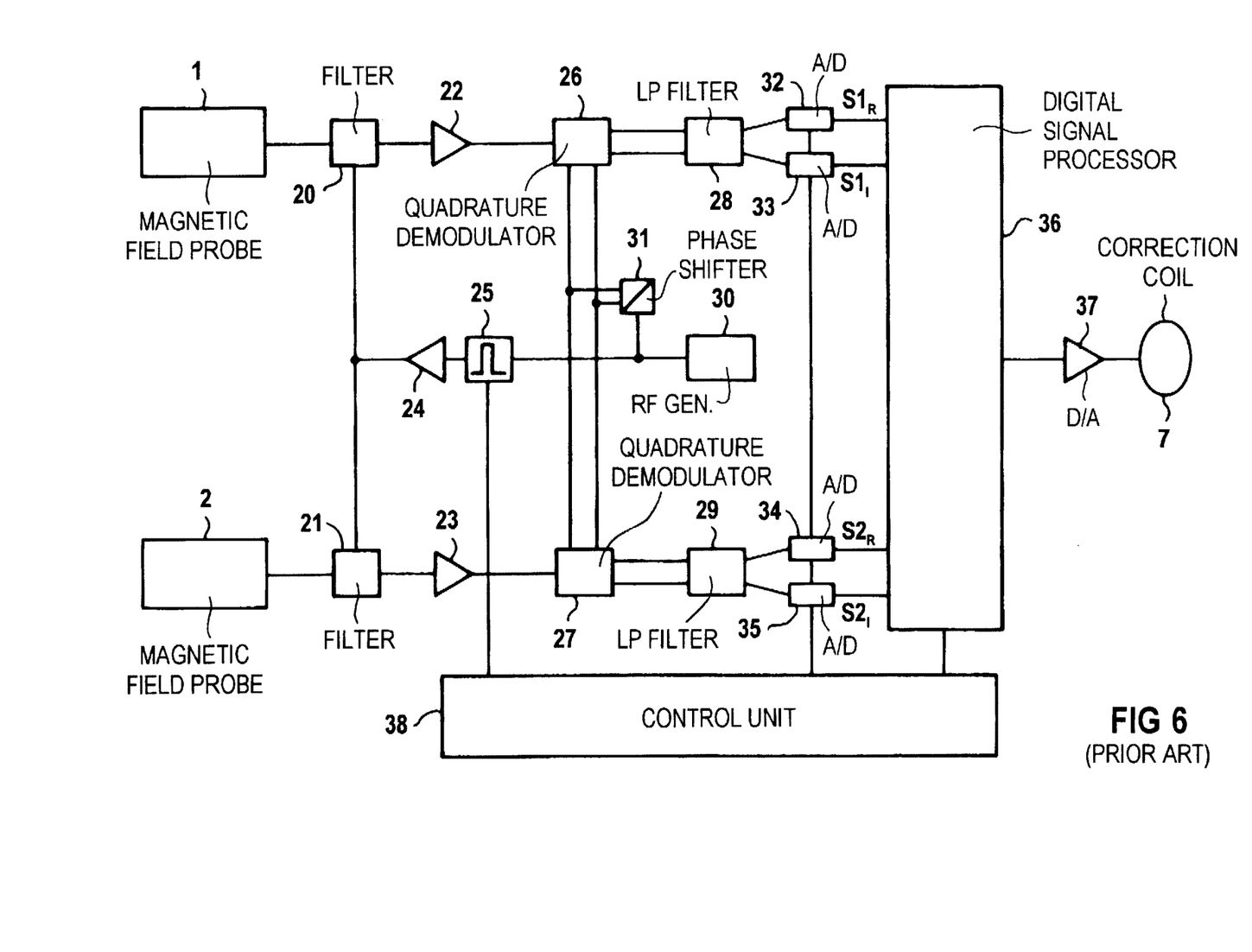
FIG. 6 shows an evaluation circuit for measurement signals of the MR magnetic field probes, as described in German OS 44 19 091, for explaining the advantages achieved by the inventive design.

As a basis for comparison of the inventive embodiments with the circuit according to German OS 44 19 061, FIG. 6 shows this circuit.

The probes 1 and 2 are thereby connected with the output of an RF amplifier 24, or with respective inputs of RF amplifiers 22 and 23, via respective transmitter/receiver separating filters 20 and 21. For the generation of the transmission signal, a RF generator 30 is provided, which in the transmission mode drives the input of the RF amplifier 24 via a control circuit 25.

In the reception mode, the output signals of the RF signal amplifiers 22 and 23 are respectively supplied to quadrature demodulators 26 and 27. The quadrature demodulators 26 and 27 receive reference signals from the RF generator 30 whereby, by means of a phase shifter 31, two signals, phase-displaced by 90°, are used. The two signals respectively generated by quadrature detectors 26 and 27, which correspond to real and imaginary parts, are supplied to analog/digital converters 32 to 35 via respective lowpass filters 28 and 29. The digital output signals of the digital/ analog converters 32 to 35 are processed into a control signal in a digital signal processor 36, converted to analog signals by a digital/analog converter 37, and are then supplied to a correction coil 7 for the magnetic field. The entire arrangement is controlled by a control unit 38.

Figure 7:
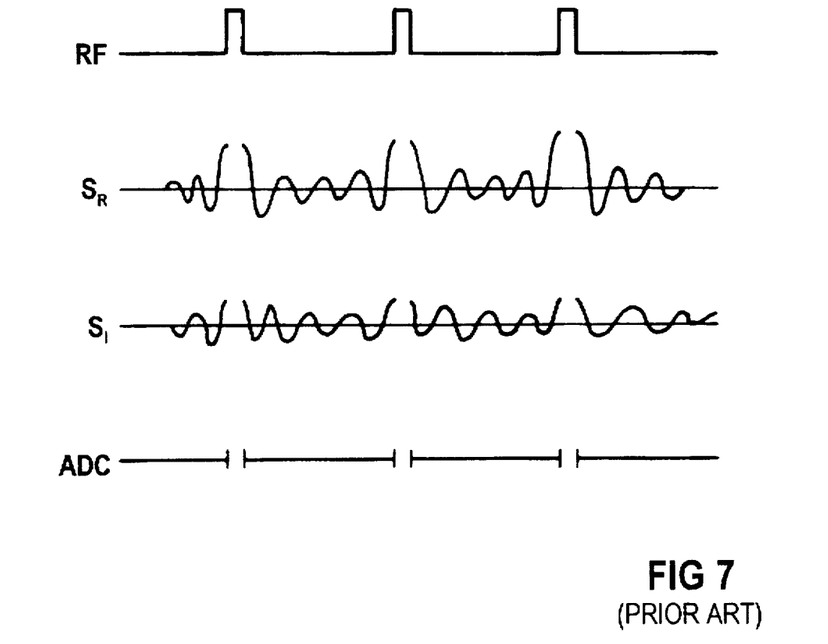
FIG. 7 is a pulse diagram for the measurement of the magnetic field in an MR probe.

FIG. 7 shows the sequence of the RF pulses RF and the curve of the MR signal, with real part $S_R$ and imaginary part $S_I$. The probe is operated in what is known as steady-state-free-precession mode. The RF signals RF are very short, since their time duration represents an undesirable dead time for the measurement. In addition, the RF pulses must be broad-band, i.e., not frequency-selective, because under some circumstances the pulsed gradients generate large MR frequency displacements.

Figure 8:
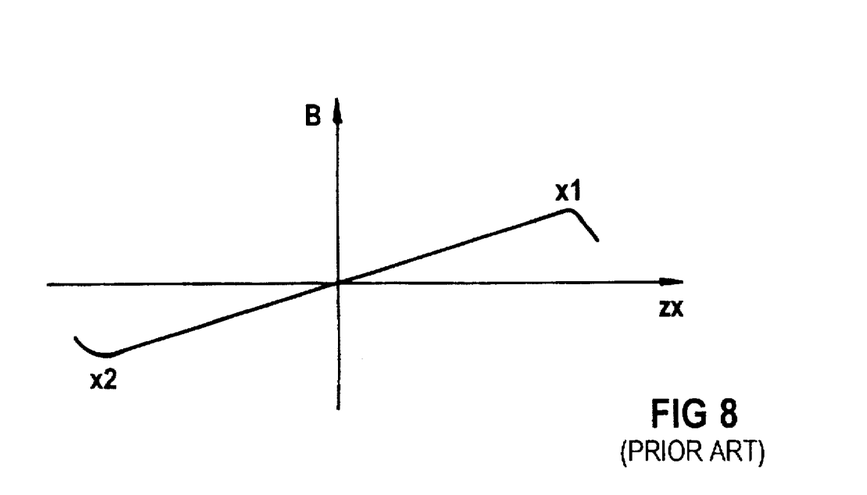
FIG. 8 shows the field curve of a gradient field along the, x direction in a nuclear magnetic tomography device.

FIG. 7 also shows the operating state of the analog/digital converter ADC, whereby the intervals in which the measurement signal is sampled are identified with a continuous line. The rate of repetition of the RF pulses RF should be low, so that the ratio of dead time to measurement time is small. The required spacing of the RF pulses is essentially determined by the $T_2^*$ time of the sample 11, which is determined by the material itself, but also by the size and shape of the sample. It must be taken into account that the sample 11 (at least due to the intermittently activated gradients) is located in a non-homogeneous field, as a rule. This problem can be mitigated, however, by attaching the probes 1 and 2 respectively positions in the MR apparatus that have a low local field gradient. These positions are designated in FIG. 8, which shows the curve of the magnetic field B along the x axis, for example with x1 and x2.

Thus, the size of the sample, its location, and the pulse spacing must be chosen, taking into account the field distribution to be determined previously in the nuclear magnetic resonance tomograph, in such a way that an adequate signal-noise ratio results at all times.

As material for the sample, it is advantageous to use a liquid, a gel or an interlaced liquid (e.g. rubber), having a high density and MR-suitable nuclei with a long $T_2$ time. Water, a hydrocarbon, or the like are suitable. If the probes 1 and 2 are operated at the resonant frequency of the protons, care must be taken to provide a good shielding for the entire arrangement. The imaging in the MR apparatus also typically ensues at the resonant frequency of protons. Since the magnetic field measurement is also supposed to continue during the measurement of the nuclear magnetic resonance signals required for the imaging, without shielding strong mutual influences would result.

If the MR probes 1 and 2 are operated at the proton resonant frequency, the advantage however results that a common RF generator can be used for the determination of the RF end pulses for the imaging and the magnetic field measurement.

Samples having other nuclei, however, can also be used in the probes 1 and 2, whose MR resonance frequency is different from that of protons. Fluoride compounds (fluorocarbons), for example, are well-suited, due to their high MR sensitivity.

By means of the method described above, both probes thus emit a nuclear magnetic resonance signal that is uninterrupted up to the short transmission pulses, whose frequency corresponding to the Larmor relation $\omega = \gamma \cdot B$ is at all times absolutely precisely proportional to the momentary magnetic field at the location of the sample.

The further processing of the demodulated probe signals in the circuit according to FIG. 6 ensues along a digital path in a digital signal processor 36.

Figure 9:
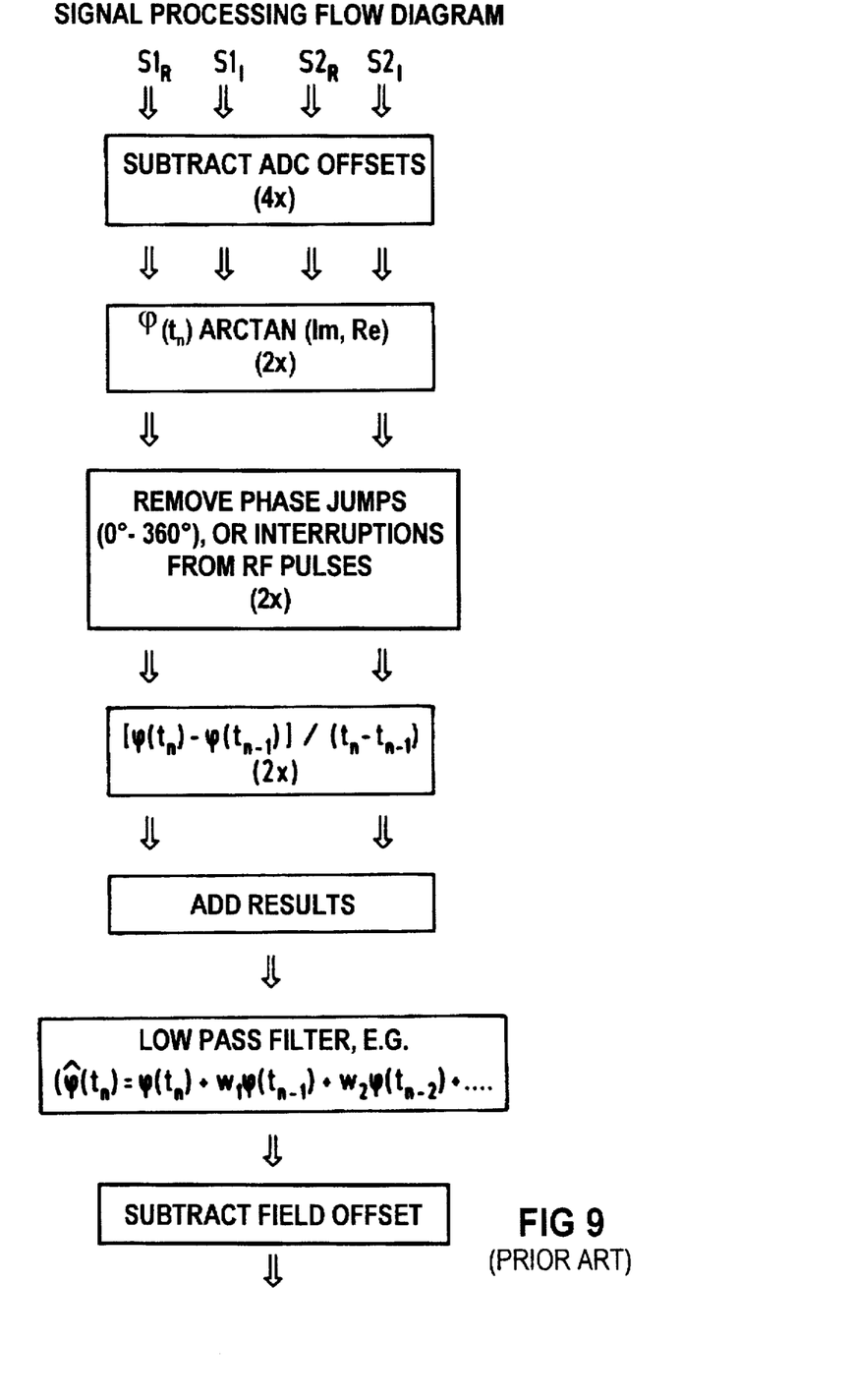
FIG. 9 is a flow diagram for evaluation of the MR signals corresponding to FIG. 6, and for the calculation and compensation of field instabilities.

FIG. 9 shows a flow diagram of the signal processing in the digital signal processor 36. The respective real and imaginary parts of the nuclear magnetic resonance signal for both probes 1 and 2, thus four signals $S1_R$, $S1_I$, $S2_R$, $S2_I$, are supplied to the digital signal processor 36. The offsets of the preceding analog/digital converters 32 to 35 are then calculated and subtracted. This function can be repeated from time to time in measurement pauses, in order to compensate offset drift.

The calculation of the frequency of the MR signals advantageously ensues in this known circuit not by Fourier transformation of the time signal, but rather by calculation of the time derivative of the phase ($\omega = d\phi/dt$). The phase $\phi(t_n)$ is determined by means of a four-quadrant evaluation of the arctangent of the real and imaginary part. This method has the significant advantage that it continually acquires every frequency change immediately.

Figure 10:
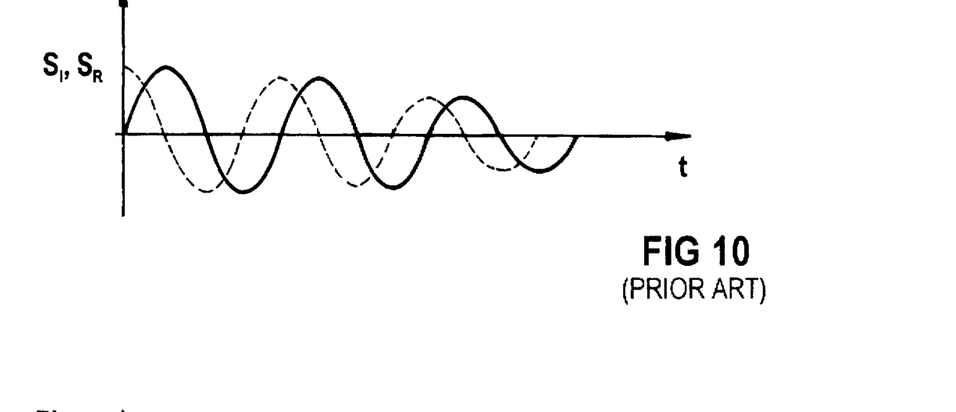
FIGS. 10 to 12 respectively show phase curves of the output signals of an MR probe, with elimination of points of discontinuity.
Figure 11:
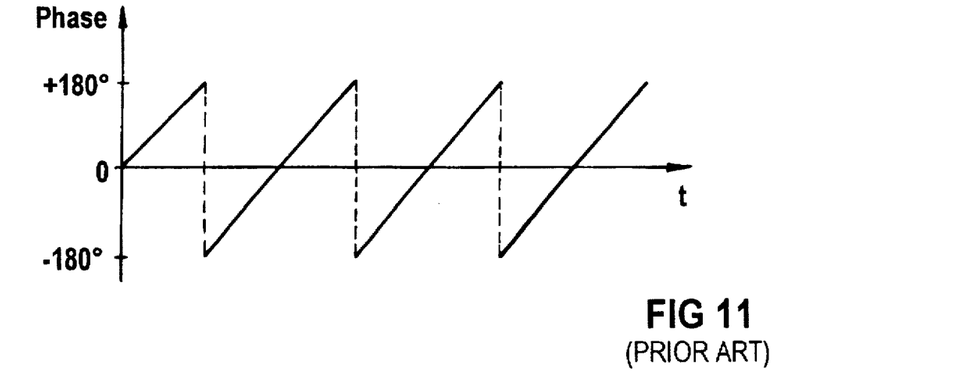
Figure 12:
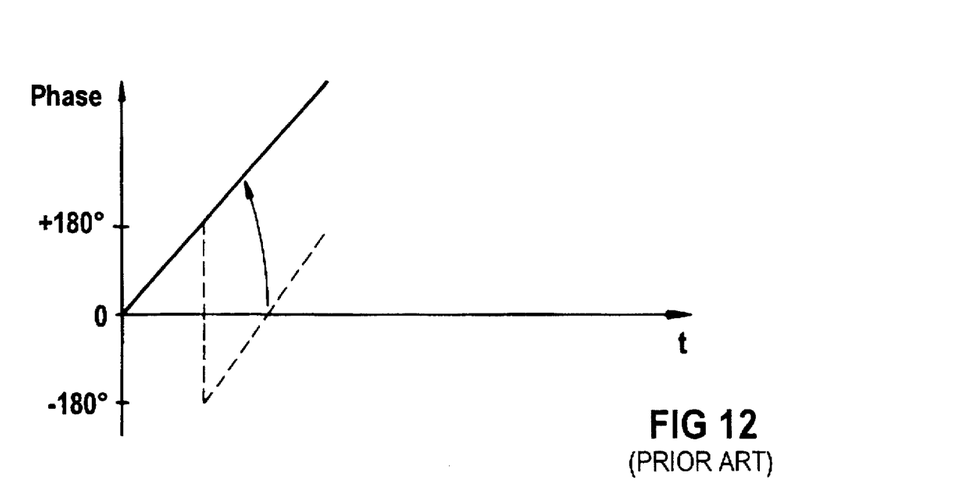

The digital signal processor 36 further contains a function that effects an adaptation of the chronological phase curve at transition points. This is explained on the basis of FIGS. 10 to 12. FIG. 10 shows the signal curve of the real part $S_R$ and the imaginary part $_{IS}$ of the demodulated nuclear magnetic resonance signal of the probe. As can be seen in FIG. 11, the phase curve comprises jumps from +180° to −180°. This causes problems during evaluation. In order to avoid this, the phase curves are displaced so that a continuous transition results.

Figure 13:
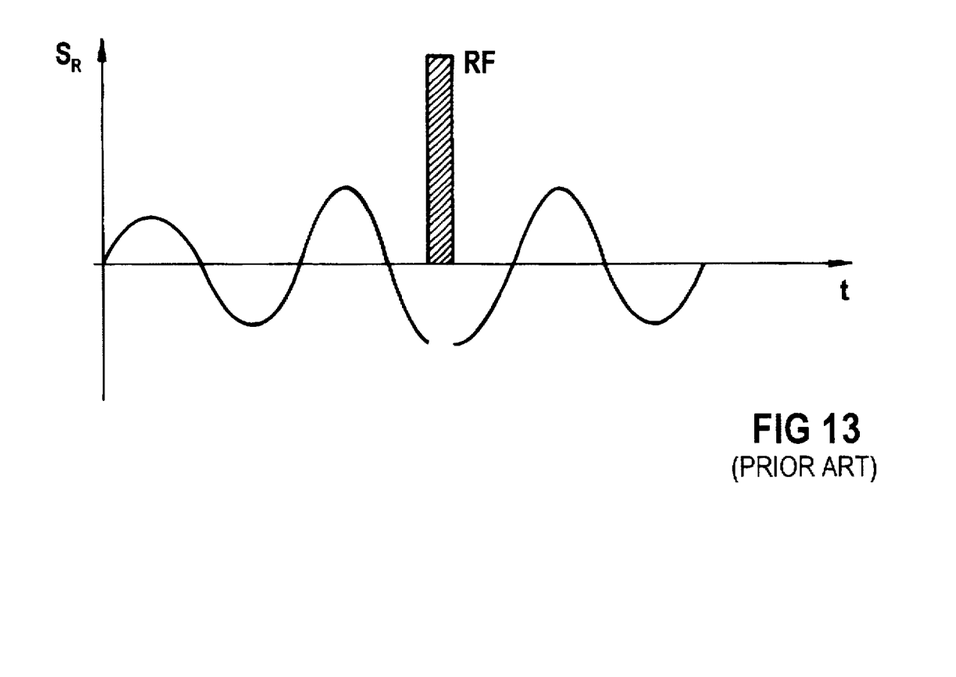
FIGS. 13 and 14 respectively show the time curve of the RF pulses and MR signals, and the phase curve thereof, with suppression of the gaps caused by the radiation of RF pulses.
Figure 14:
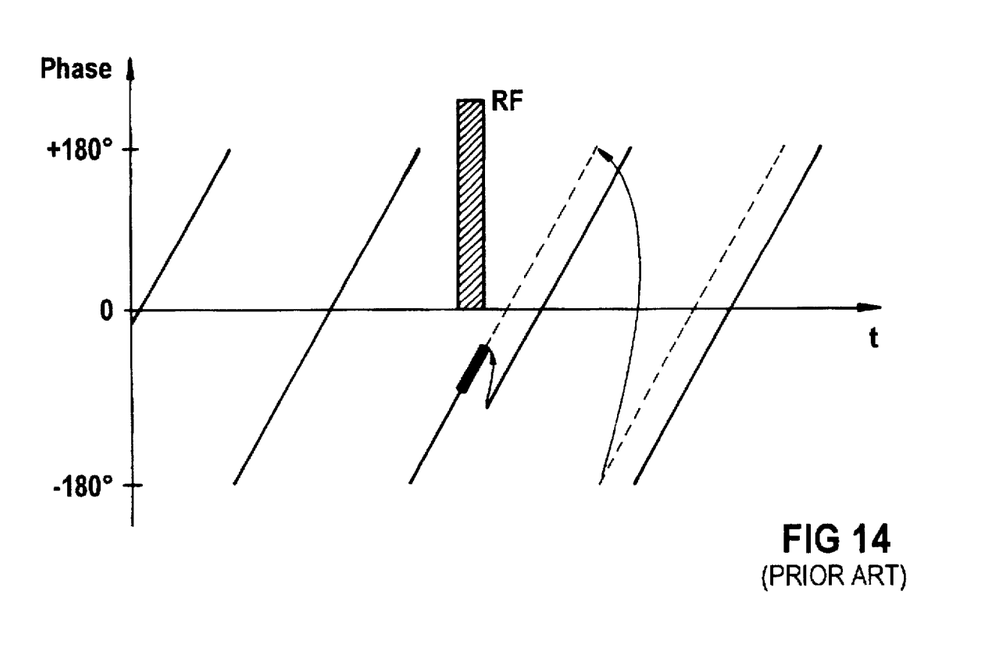

In addition, it must be ensured that an adaptation of the chronological phase curve ensues at the jump points conditioned by the RF pulses. FIG. 13 shows the real part $S_R$ of a nuclear magnetic resonance signal of one of the probes 1 or 2, this signal being interrupted during an RF pulse RF. A linear extrapolation ensues during the interruption time, as shown by means of a thick continuous line in FIG. 14. In FIG. 14, a continuous line designates the measurement values of the phase, a thick continuous line designates the extrapolated part and a broken line designates the measurement values displaced to the end of the extrapolation. As shown by the arrows in FIG. 14, the measurement values obtained after the extrapolation must be displaced, so that a curve without gaps results. In addition, the displacement explained above on the basis of FIG. 11 ensues in order to avoid the 360° jumps.

The frequency of the nuclear magnetic resonance signals of the two probes S1 and S2, which is proportional to the MR signal present at the probe position, is determined by formation of the quantity $[\phi(t_n)-\phi(t_{n-1})]/(t_n-t_{n-1})$. Subsequently, the results are added, so that the effect of gradient pulses is eliminated. Due to the spatial antisymmetry of all the pulsed gradient fields in relation to the magnetic center, and due to the centrally symmetrical arrangement of the samples, the influences of the gradient pulses disappear, and only the basic field portion remains. A lowpass filtering is carried out on the result of the addition.

Since the basic field (without gradient pulses) can be different at the two selected probe positions (field offset), in some circumstances an offset of the output signal results. This constant field offset can be determined and subtracted.

With the method shown, the external or internal disturbance fields that are to be eliminated can be determined without disturbance by the gradient pulses. It is also advantageous that disturbing field jumps or eddy fields with homogeneous field distribution, generated by possible asymmetries of the gradient coils, are likewise acquired.

The clock rate at which the acquisition and processing of measurement data ensues is determined by the position of the probes 1 and 2 and by the gradient fields which are employed. The acquisition and processing of data must, however, ensue at least with a clock rate that satisfies the Nyquist condition with regard to the MR frequency displacement of the nuclear magnetic resonance signal, caused by the gradient pulses.

The digital signal obtained in this way for the actual value of the magnetic field strength is now converted into an analog signal by a digital/analog converter 37. This analog signal is supplied, after corresponding amplification, to an auxiliary field coil 7 that compensates the disturbance field.

In the circuit shown according to FIG. 6, the hardware outlay is relatively large, since there are two complete reception and evaluation channels each having phase-sensitive demodulators, filters and two analog/digital converters, respectively for the real and the imaginary part. Considerable savings can be achieved with the exemplary embodiments of the invention shown in FIGS. 15 to 17.

Figure 15:
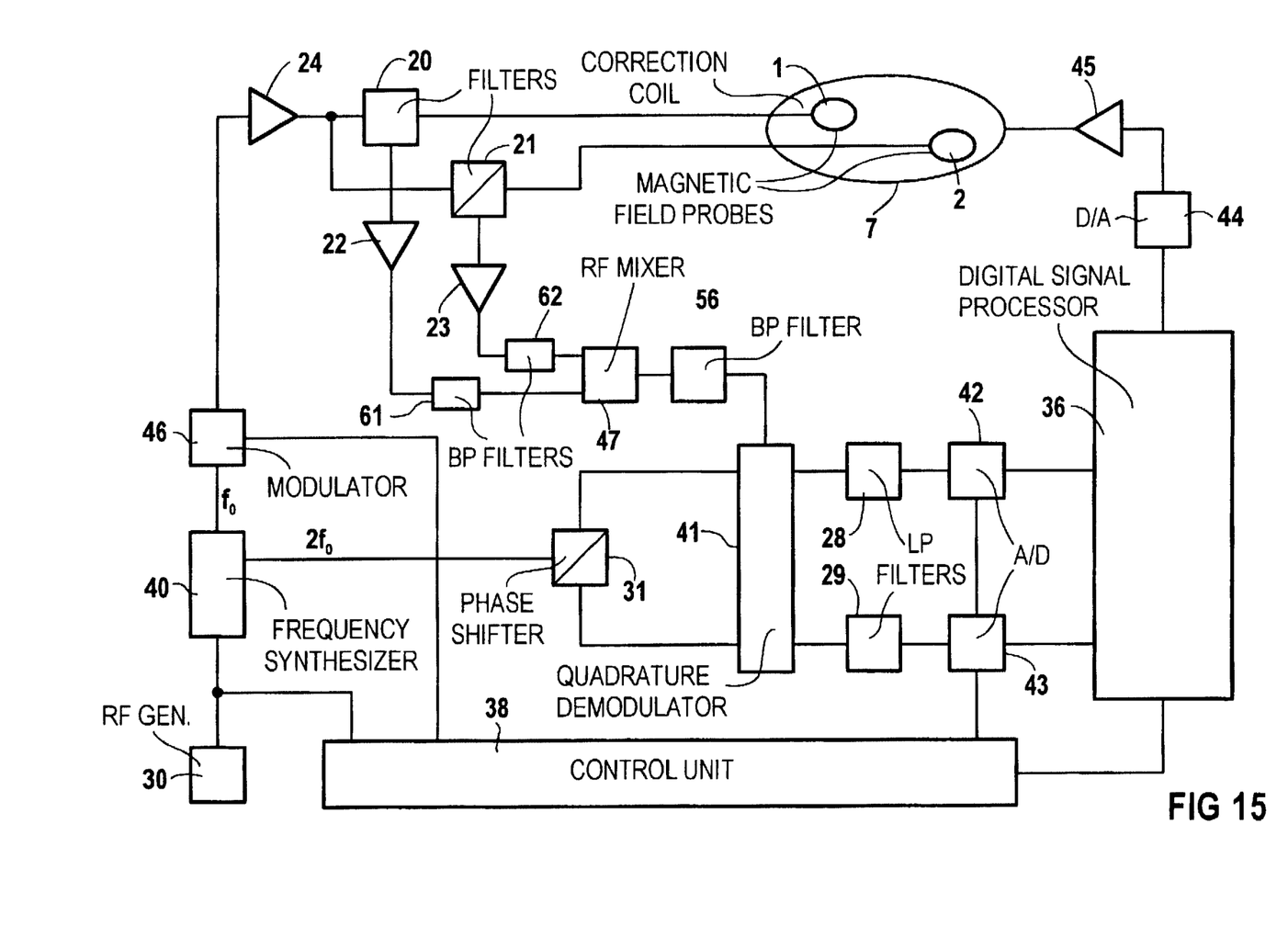
FIGS. 15 to 17 respectively show different exemplary embodiments of the invention.

The exemplary embodiment according to FIG. 15 differs from the circuit according to FIG. 6 most importantly in that the output signals of the RF signal amplifiers 22 and 23 are supplied to a multiplying RF mixer 47.

As is generally known, a multiplying RF mixer produces two frequency components that respectively correspond to the sum and the difference of the input signals. The frequency of the sum frequency signal is thereby proportional to the basic field without the influence of gradient circuits.

The RF amplifiers 22 and 23 should have an automatic gain control, in order to ensure defined input levels for the multiplying RF mixer 47.

For a good signal-noise ratio, bandpass filters 61 and 62 (at $f_0$) are advantageously provided at the inputs of the multiplying RF mixer 47, and (optionally) a further bandpass filter 56 (at $2f_0$) is provided at the output of the RF mixer.

The output signal of the mixer 47 is demodulated with a quadrature demodulator 41, i.e. a phase-sensitive demodulator. Since, given a resonant frequency $f_0$ of the MR probes in the undisturbed basic field, the target value of the sum RF signal lies at $2f_0$, this frequency $2f_0$ must be made available as the reference frequency for the quadrature demodulator 41. Thus, both the frequency $f_0$, for the excitation of the MR probes 1, 2, and the frequency $2f_0$, which is made available to the quadrature demodulator 41 as a reference in two components, phase-displaced 90°, are generated using a synthesizer 40.

Via lowpass filters 28 and 29, the low-frequency signal portions are filtered out of the two output signals of the quadrature demodulator 41, and are digitized with analog/digital converters 42 and 43. If the basic magnetic field exhibits no deviation from the target value, i.e. the sum frequency signal at the output of the RF mixer 47 agrees with the predetermined basic frequency $2f_0$, the low-frequency signal has the frequency zero; given a field deviation, it has a frequency that increases proportionally to the deviation.

The determination of this frequency ensues, for example, in the manner described above by the calculation of the time derivation of the phase in a digital signal processor 36. As in the exemplary embodiment according to FIG. 6, the digital signal for the deviation of the magnetic field strength from the target value is converted into an analog signal via a digital/analog converter 44, is amplified by an analog amplifier 45, and is supplied to an auxiliary field coil 7, which compensates an existing disturbance field.

In this exemplary embodiment, since a sum signal that represents the desired homogeneous portion of the magnetic field is already obtained with the mixer 47, it suffices to use one quadrature demodulator having two filters and analog/digital converters connected downstream. In comparison with the arrangement according to FIG. 6, the outlay for the required hardware is thus considerably reduced.

Figure 16:
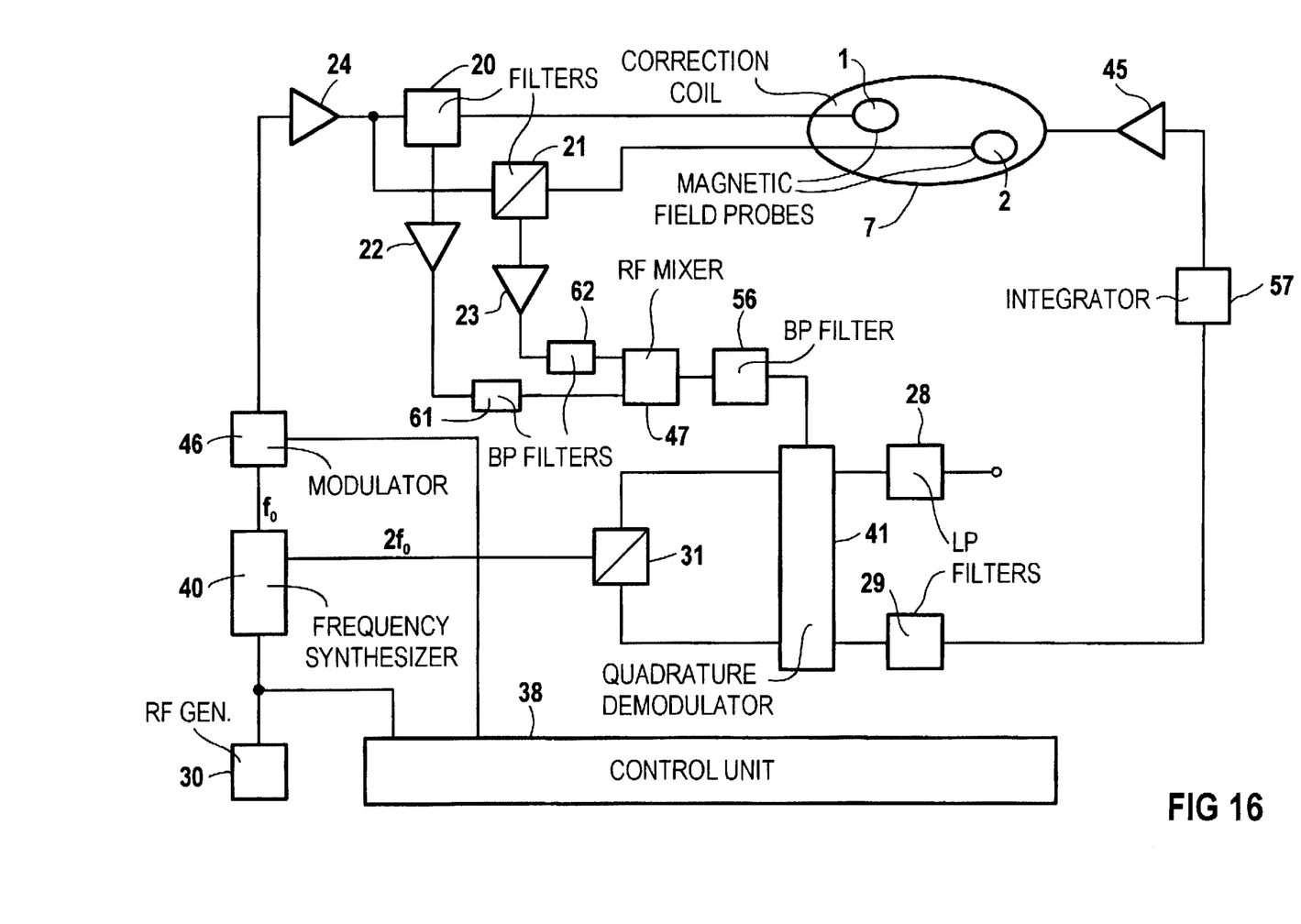

A further reduction of the hardware outlay is possible by using the phase signal after the lowpass filtering, obtained with the quadrature detector 41, directly for the control of the basic field. This operates in the manner of a "phase locked loop" design. Given a suitable phase relation, the output signal of the lowpass filter 29 can be used directly for the control of the basic field; otherwise, it can be used for this via suitable analog modules, e.g. an integrator 57. By this means, the A/D converter and all further digital computing components can be saved.

Figure 17:
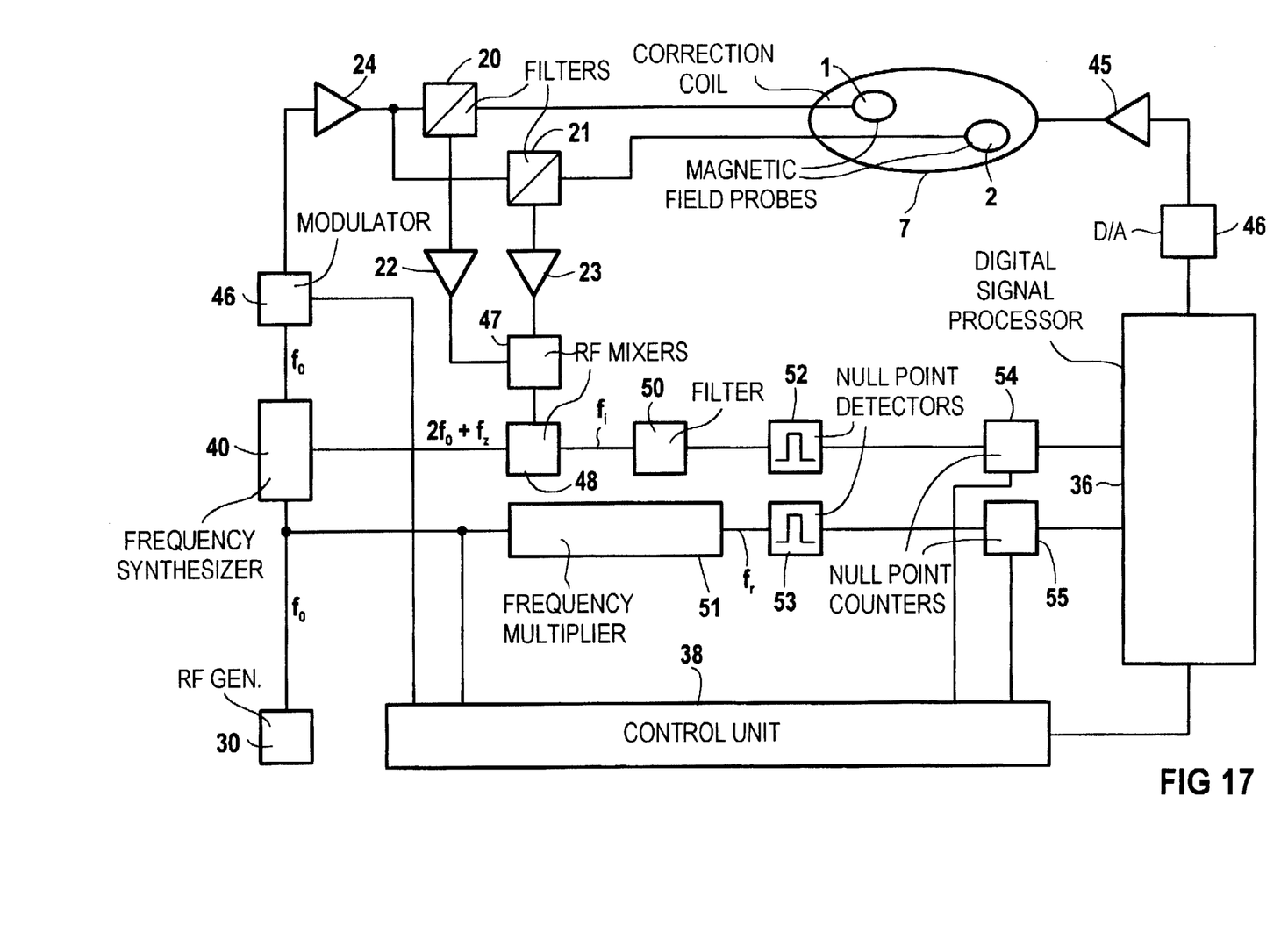

Another exemplary embodiment is shown in FIG. 17 wherein the deviation of the basic magnetic field from the target value is determined by counters. In this case, as in the previous exemplary embodiment, the synthesizer 40 delivers a signal having a frequency $f_0$ that corresponds to the resonance frequency of the MR probe in the target state, and that is supplied to the MR samples 1 and 2 upon excitation. As a second output signal, the synthesizer 40 generates a signal with the frequency $2f_0+f$, whereby in this case $f_z$ is an intermediate frequency. The output signal of the first RF mixer 47 is now mixed with the signal of frequency $2f_0+f_z$ in a second multiplying RF mixer 48. At the output of the second mixer 48, a sum frequency ($2f_0+f_z+2f$) and a difference frequency $f=(2f+f_z-2f)$ are thus again present. The difference frequency $f_i$, which in the target state agrees with the intermediate frequency, is filtered out with a filter 50. The filtered signal is supplied to a first null point counter 54 via a first null point detector 52.

In addition, an RF signal with frequency $f_r$, obtained from the basic frequency $f_0$ via a frequency multiplier 51, is supplied to a second null point counter 55 via a second null point detector 53. The null point counters 54 and 55 are driven by the control means 38 in such a way that both null point counters 54 and 55 are started with the first zero crossing of the difference frequency signal $f_i$. As soon as the null point counter 54 has counted a fixed, predetermined number $N_1$ of null points in the difference frequency signal $f_i$, the second null point counter 55 is stopped. The frequency of the difference frequency signal $f_i$ results from the counter state $N_2$, which is then to be counted, of the period counter, on the basis of the following relation:

$$f_i = f_r \cdot N_1/N_2$$

If the measured magnetic field is at its target value, a signal with the frequency $$f_i = 2f_0 + f_z - 2f_0 = f_z$$

is obtained at the output of the filter 50.

If the measured magnetic field deviates above or below the target value, the frequency $f_i$ also deviates from the intermediate frequency $f_z$, proportionally to the field deviation.

The precision of the frequency measurement is correspondingly increased by counting not just one period of the difference frequency signal, but several periods. The theoretically possible precision also depends on the comparison frequency $f_r$. It is thus advantageous to use a comparison frequency $f_r$, that is 100 to 1000 times as large as the basic frequency $f_0$.

The frequency deviation determined on the basis of the above-named relation is proportional to the field deviation, and is thus used for the control of the basic field via a D/A converter 46.

In this arrangement, in comparison with the exemplary embodiment according to FIG. 15 the quadrature detector and the A/D converter are not needed and are replaced by the elements described above.

Although modifications and changes may be suggested by those skilled in the art, it is the intention of the inventors to embody within the patent warranted hereon all changes and modifications as reasonably and properly come within the scope of their contribution to the art.

We claim as our invention:

1. An arrangement for measuring a basic magnetic field produced by a magnet of a nuclear magnetic resonance tomography apparatus, said tomography apparatus having an examination region, said arrangement comprising:

first and second MR magnetic field probes disposed relative to said examination region so as to be centrally symmetrical with respect to a center of said magnetic field, each of said first and second magnetic field probes generating an output signal having a frequency proportional to said magnetic field;

a multiplying RF mixer, supplied with the respective output signals from said first and second MR magnetic field probes, which emits a sum frequency signal, having a sum frequency, obtained by multiplying the respective output signals of said first and second MR magnetic field probes; and means for identifying an actual value of said magnetic field from said sum frequency of said sum frequency signal.

2. An arrangement as claimed in claim 1 for use with a sample material, having a $T_2^*$ time, disposed in said examination region, and said arrangement further comprising:

each of said first and second MR magnetic field probes having a transmission antenna;

means for operating the respective transmission antennas of said first and second MR magnetic field probes for exciting said sample material with a continuous sequence of short RF pulses having a spacing between said RF pulses approximately equal to said $T_2^*$ time of the sample material; and means for receiving nuclear magnetic resonance signals from said sample material in a time between said RF pulses.

3. An arrangement as claimed in claim 1 further comprising:

means for exciting each of said first and second MR magnetic field probes with an excitation frequency; and said means for identifying the actual value of the magnetic field comprising a quadrature demodulator supplied with said output signal of said RF mixer and supplied with a reference frequency which is twice said excitation frequency.

4. An arrangement as claimed in claim 3 wherein said quadrature demodulator emits a demodulated signal, and wherein said means for identifying the actual value of said magnetic field further comprises a low-pass filter which filters said demodulated signal and emits a low-pass filtered signal having a phase, and means for taking a first derivative with respect to time of the phase of said low-pass filtered signal.

5. An arrangement as claimed in claim 3 wherein said quadrature demodulator emits a demodulated signal, and wherein said means for identifying the actual value of said magnetic field further comprises a low-pass filter which filters said demodulated signal and emits a low-pass filtered signal, and means for directly using said low-pass filtered signal for controlling said basic magnetic field.

6. An arrangement as claimed in claim 1 wherein said means for identifying the actual value of said magnetic field comprises means for identifying the sum frequency of the sum frequency signal by determining a time between two successive zero crossings of said sum frequency signal.

7. An arrangement as claimed in claim 1 further comprising:

means for exciting each of said first and second MR magnetic field probes with a frequency f; and said means for identifying the actual value of said magnetic field further comprises a further RF mixer supplied with the output signal of said RF mixer and with a further signal having a frequency $2f_0 + f_z$, wherein $f_0$ is the resonant frequency of each MR probe in a target state and $f_z$ is an intermediate frequency, said further RF mixer emitting a difference frequency signal having a difference frequency $f_i$, and means for identifying a time between a defined number of zero crossings of said difference frequency signal as an identification of said actual value of said magnetic field.

8. An arrangement as claimed in claim 7 wherein said means for identifying the time between said defined number of zero crossings of said difference frequency signal comprises:

a first null point counter started with a zero crossing of said sum frequency signal emitted by said RF mixer and which counts successive zero crossings of said sum frequency signal;

a second null point counter which starts simultaneously with said first null point counter and which counts null points of a comparison signal having a higher frequency than said sum frequency signal; and means, after a predetermined number of null points of said sum frequency signal, reading out a state of said second null point counter as an identification of the actual value of said magnetic field.

9. An arrangement as claimed in claim 7 wherein said means for identifying the time between said defined number of zero crossings of said difference frequency signal comprises:

a first null point counter started with a zero crossing of said difference frequency signal emitted by said further RF mixer and which counts successive zero crossings of said difference frequency signal;

a second null point counter which starts simultaneously with said first null point counter and which counts null points of a comparison signal having a higher frequency than said difference frequency signal; and means, after a predetermined number of null points of said difference frequency signal, reading out a state of said second null point counter as an identification of the actual value of said magnetic field.

10. A method for measuring a basic magnetic field produced by a magnet of a nuclear magnetic resonance tomography apparatus, said tomography apparatus having an examination region, said method comprising the steps of:

positioning first and second MR magnetic field probes relative to said examination region so as to be centrally symmetrical with respect to a center of said magnetic field, and generating respective output signals from said first and second magnetic field probes each having a frequency proportional to said magnetic field;

multiplying said output signals in an RF mixer, to obtain a sum frequency signal, having a sum frequency; and identifying an actual value of said magnetic field from said sum frequency of said sum frequency signal.

11. A method as claimed in claim 10 wherein each of said first and second MR magnetic field probes has a transmission antenna, said method comprising the additional steps of:

placing a sample material, having a $T_2^*$ time, in said examination region;

operating the respective transmission antennas of said first and second MR magnetic field probes for exciting said sample material with a continuous sequence of short RF pulses having a spacing between said RF pulses approximately equal to said $T_2^*$ time of the sample material; and receiving nuclear magnetic resonance signals from said sample material in a time between said RF pulses.

12. A method as claimed in claim 10 comprising the additional steps of:

exciting each of said first and second MR magnetic field probes with an excitation frequency; and identifying the actual value of the magnetic field using a quadrature demodulator supplied with said sum frequency signal of said RF mixer and supplied with a reference frequency which is twice said excitation frequency.

13. A method as claimed in claim 12 wherein said quadrature demodulator emits a demodulated signal, and wherein the step of identifying the actual value of said magnetic field further comprises low-pass filtering said demodulated signal and thereby obtaining a low-pass filtered signal having a phase, and taking a first derivative with respect to time of the phase of said low-pass filtered signal.

14. A method as claimed in claim 12 wherein said quadrature demodulator emits a demodulated signal, and wherein the step of identifying the actual value of said magnetic field comprises low-pass filtering said demodulated signal and thereby obtaining a low-pass filtered signal, and directly using said low-pass filtered signal for controlling said basic magnetic field.

15. A method as claimed in claim 10 wherein the step of identifying the actual value of said magnetic field comprises identifying the sum frequency of the sum frequency signal by determining a time between two successive zero crossings of said sum frequency signal.

16. A method as claimed in claim 10 comprising the additional steps of:

exciting each of said first and second MR magnetic field probes with a frequency f; and identifying the actual value of said magnetic field by supplying a further RF mixer supplied with the output signal of said RF mixer and with a further signal having a frequency $2f_0 + f_z$, wherein $f_0$ is the resonant frequency of each MR probe in a target state and $f_z$ is an intermediate frequency, to obtain a difference frequency signal from said further RF mixer having a difference frequency $f_i$, and identifying a time between a defined number of zero crossings of said difference frequency signal as an identification of said actual value of said magnetic field.

17. A method as claimed in claim 16 wherein the steps of identifying the time between said defined number of zero crossings of said difference frequency signal comprises the steps of:

starting a first null point counter with a zero crossing of said sum frequency signal emitted by said RF mixer and counting successive zero crossings of said sum frequency signal in said first null point counter;

starting a second null point counter which starts simultaneously with said first null point counter and counting, in said second null point counter, null points of a comparison signal having a higher frequency than said sum frequency signal; and after a predetermined number of null points of said sum frequency signal, reading out a state of said second null point counter as an identification of the actual value of said magnetic field.

18. A method as claimed in claim 16 wherein the steps of identifying the time between said defined number of zero crossings of said difference frequency signal comprises the steps of:

starting a first null point counter with a zero crossing of said difference frequency signal emitted by said RF mixer and counting successive zero crossings of said difference frequency signal in said first null point counter;

starting a second null point counter which starts simultaneously with said first null point counter and counting, in said second null point counter, null points of a comparison signal having a higher frequency than said difference frequency signal; and after a predetermined number of null points of said difference frequency signal, reading out a state of said second null point counter as an identification of the actual value of said magnetic field.

* * * * *